United States Patent [19]

Sakurai et al.

[11] 4,410,801
[45] Oct. 18, 1983

[54] ION IMPLANTATION EQUIPMENT

[75] Inventors: Junji Sakurai, Tokyo; Haruhisa Mori, Yokohama, both of Japan

[73] Assignee: Fujitsu Limited, Kawasaki, Japan

[21] Appl. No.: 217,758

[22] Filed: Dec. 18, 1980

[30] Foreign Application Priority Data

Dec. 26, 1979 [JP] Japan ................................ 54-169610

[51] Int. Cl.³ .......................................... H01J 37/317
[52] U.S. Cl. .................................. 250/492.2; 250/398
[58] Field of Search ................ 204/192 N; 250/492.2, 250/492.3, 398; 313/361.1, 359.1

[56] References Cited

FOREIGN PATENT DOCUMENTS 138589  11/1979  Fed. Rep. of Germany ... 250/492.2

OTHER PUBLICATIONS

Dill et al., "The Impact of Ion Implantation on Silicon Device and Circuit Technology", Solid State Technology, Dec. 1972, pp. 27–35.
Duffy et al., "Impurity Profile Control During Ion Implantation", IBM Tech. Discl. Bull. 12 (1), Jun. 1969, p. 27.

Primary Examiner—Alfred E. Smith
Assistant Examiner—Carolyn E. Fields
Attorney, Agent, or Firm—Staas & Halsey

[57] ABSTRACT

An equipment for implanting impurity material ions into a semiconductor wafer which supplies acceleration voltage and which continuously and automatically changes the acceleration voltage within a predetermined range for the purpose of producing impurity layers having a uniform concentration distribution in the direction of the depth of wafer. The equipment is effective in making fine patterns of integrated circuits. In one embodiment, the equipment changes the acceleration voltage continuously so that the frequency of the acceleration voltage is high enough to form a pillar shaped impurity layer at positions in a wafer while the ion beam is irradiated onto the positions respectively thereby to form an impurity layer having a uniform impurity distribution profile. In another embodiment of the invention, the equipment changes the acceleration voltage continuously but slow enough with respect to the scan frequency so that the ions are implanted to reach a certain depth in the first scan, another depth in the second scan and so on.

7 Claims, 9 Drawing Figures

ION IMPLANTATION EQUIPMENT

BACKGROUND OF THE INVENTION

This invention is directed to a ion implantation equipment which is capable of automatically forming an impurity layer having a uniform distribution of impurity concentration in the direction of depth of a semiconductor wafer.

In producing patterns of integrated circuits, it is required, as is generally known, to make the patterns extremely fine. For this purpose, it is necessary to control minutely the distribution of impurity concentration not only in the lateral direction but also in the vertical direction of the semiconductor wafer.

Hitherto, formation of impurity layers has been effected by means of thermal diffusion of impurity material. Thermal diffusion being a statistical phenomenon, control of the profile of impurity layers was not effectively achieved.

Recently, technology has been developed to implant ions of an impurity material into the wafer. In order to obtain a desired profile of the impurity layer by ion implantation, treatment of the substrate at relatively low temperature or laser annealing has been proposed to prevent thermal diffusion of the implanted ions. It is therefore important that the desired profile is produced by ion implantation prior to such treatment.

Ion implanting an impurity material into the surface of a silicon semiconductor wafer 2 two dimensionally in the X- and Y-directions is shown in FIG. 1. If the acceleration voltage or energy of an ion beam of which trace is shown by the dotted line 4 in FIG. 1 is constant, shallow impurity layers are formed which have the maximum impurity concentration at a predetermined depth from the surface of wafer 2. In order to form impurity layers of constant concentration having the desired thickness in the direction of depth as shown in FIG. 2, the acceleration voltage or energy E of the ion beam must be successively altered from $E_1$ to $E_n$ to repeat the process of ion implantation n times. Conventional equipments for ion implantation are provided with thumb nuts or finger screws for manually adjusting the acceleration voltage or energy E by the operator, but it is an extremely complicated task for the operator to repeat n times the manipulation of ion implanting at acceleration voltage $E_1$ for a predetermined length of time, at voltage $E_2$ for another length of time and so forth. If each difference of energy increase represented by $E_2-E_1$ and so forth is made larger, that is if n is made smaller, the abovedescribed manual operation may be rendered simpler. However, if n is made smaller, the change of the impurity concentration in the direction of depth of the wafer becomes inevitably large.

SUMMARY OF THE INVENTION

It is therefore the primary object of the invention to offer an equipment which automatically forms impurity layers having a uniform concentration distribution throughout the predetermined thickness by scanning the ion beam.

In using the equipment according to the invention, the acceleration voltage or energy E of the ion beam is continuously changed within the range of $E_1 \leq E \leq E_n$ (FIG. 2), and the said operation is repeated automatically several times. In order to obtain a practically uniform concentration distribution throughout $d_1$ to $d_n$ within the interior of wafer 2 (d's representing the depth from the surface of the wafer) in the said operation, a certain limitation is placed on $f_E$, which is the frequency of change of the value or velocity of the acceleration voltage E, relative to $f_X$, $f_Y$, which are the scanning frequencies or velocities of the ion beam in the X- and Y-directions, respectively.

In other words, in the ion implantation equipment according to the invention which is capable of implanting ions of an impurity material by an ion beam scanning the surface of a semiconductor wafer in the X- and Y-directions, the characterizing feature is that the accelerating voltage of ions are continuously and automatically changed within a predetermined range while the scanning is being carried out.

According to another feature of the invention, the acceleration voltage is periodically changed by the equipment of the invention with a cycle of $\Delta t$, which is represented by an equation $$\Delta t = (\Delta L/nL)t$$

in order that n cycles of acceleration voltage are completed while the ion beam is irradiated onto a certain point of the wafer. In the above equation, L and $\Delta l$ represent the width of the scanned region along the direction of the scanning line of the ion beam and the width of the ion beam, respectively, t the period of time which the ion beam takes in crossing the scanned region in said direction and n an arbitrary integer.

According to a further feature of the invention, the equipment of the invention is provided with an acceleration voltage supply source which periodically changes the acceleration voltage with a cycle $t_0$ which is expressed by an equation $$t_0 = n\Delta t_0$$

where $\Delta t_0$ is the length of time during which the ion beam begins scanning from a starting point and returns to the said starting point after completion of scanning, and n typically a number larger than 10, that is to say, the frequency of the acceleration voltage is determined by the scanning frequency.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

Figure 3:
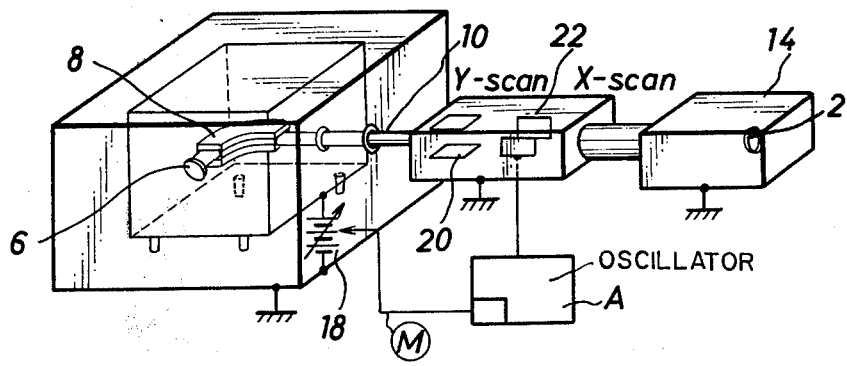
FIG. 3 is a schematic picture view of one embodiment of the invention.

An embodiment of the invention is shown in a schematic picture view of FIG. 3. In this equipment, an analyser magnet 8 permits only desired ions from an ion source 6 to pass through it, and an ion beam which has passed through the magnet 8 is accelerated by an accelerator 10. The ion beam thus accelerated is directed onto a wafer 2 within a work chamber 14. Deflection of the ion beam in X- and Y-directions is effected by deflectors 22 and 20, respectively. A line (M) leading from an $f_X$ oscillator A is connected to a variable power source means 18 which automatically changes the acceleration voltage E applied to the ion beam, with the other line from oscillator A being connected to the X-deflector 22.

Figure 4:
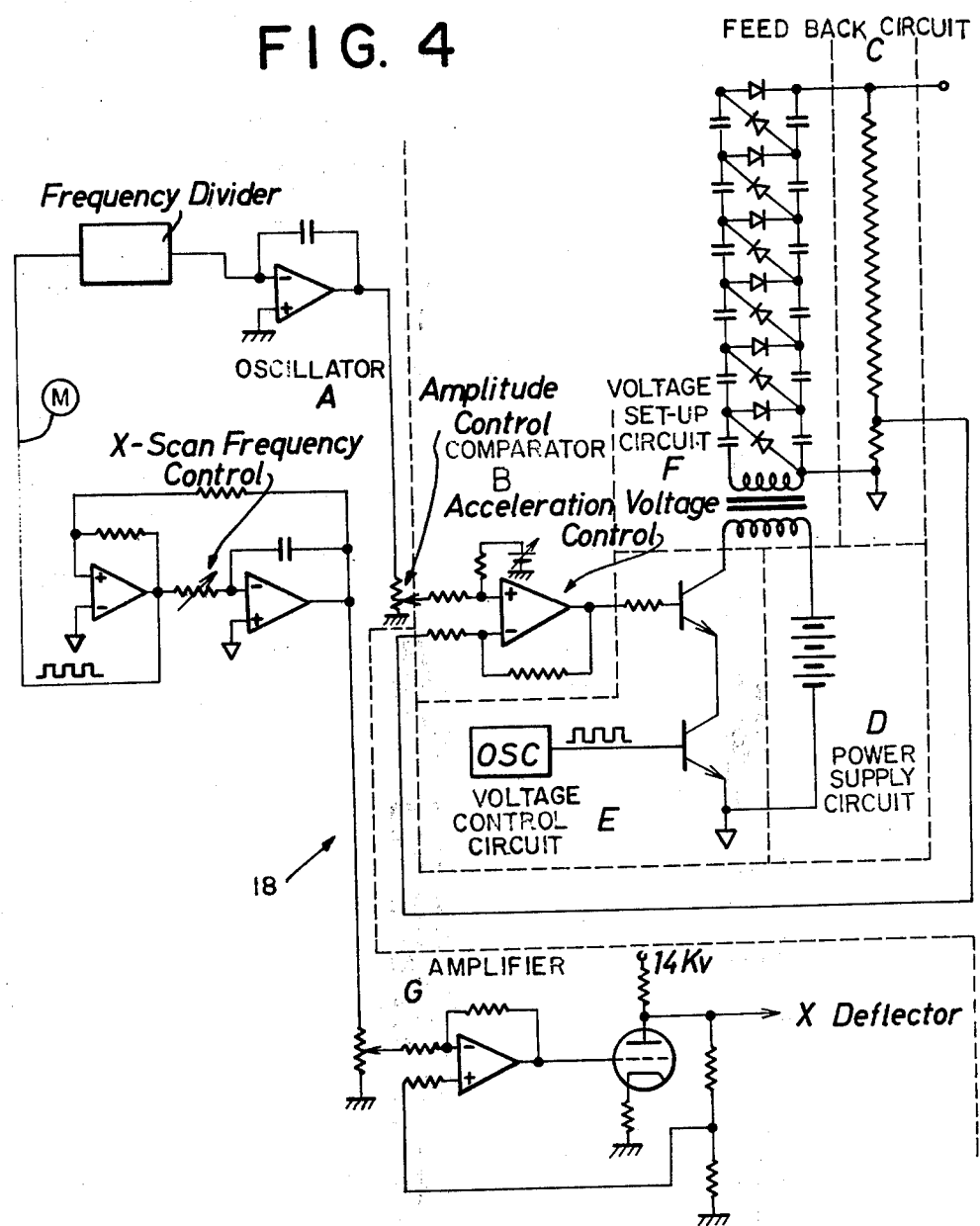
FIG. 4 is a circuit diagram of the variable power source device for the embodiment of FIG. 3, FIGS. 5A and 5B are side and front views, respectively, of a mechanical scanner for an embodiment of the present invention.

FIG. 4 is a circuit diagram of a variable power source 18 for the embodiment of FIG. 3 in which a low voltage $V_L$ is led, through a power supply circuit D and voltage control circuit E, to a Cockcroft type voltage step-up circuit F where it raised to a high voltage in the order of 50 to 400 KV. An input of the voltage set-up circuit F is not $V_L$ itself, but a low voltage $V'_L$ regulated by voltage control circuit E which provides a voltage signal of a rectangular wave form having a frequency of 10 KHz for example with a peak voltage $V'_L$. According to this invention this peak voltage is also changed continuously at a relatively low frequency $f_E$ by comparator B comparing an output of feed back circuit C, which feeds a part of high voltage $V_H$ by dividing it by a resistor of high value, and a sweep wave form output of saw-teeth or triangular shape of frequency $f_E$ from signal generator or oscillator A. The high frequency of the input voltage $V_E$ does not appear at the output terminal due to the filtering effect of the voltage set-up circuit F. Thus, output $V_H$ of circuit F obtained by stepping up low voltage $V'_L$ continuously and repeatedly changes within the range of 50 to 400 KV synchronously with the output $f_E$ of oscillator A. This oscillator A provides a periodical output signal having a rectangular wave form to the amplifier G for generating an X-deflection signal of a high voltage to drive the X-deflector. On the other hand, a periodical signal having the same frequency and a rectangular wave form derived from the oscillator circuit is supplied to the frequency divider to generate a rectangular wave form signal having a divided frequency which is transformed into a triangular or sawteeth wave form signal by the Miller integrator of which output signal is provided to the comparator B.

Accordingly, the ratio of the frequencies of the output signal $V_H$ and the X-deflection signal can be adjusted by the frequency divider. It is to be understood with respect to the diagram of FIG. 4 that oscillator A and circuits B through F inclusive are made up of conventional components.

The through rate of the acceleration voltage in the circuits of FIG. 4 is determined by a constant CR of circuit F, frequency of oscillator OSC of circuit E and current volume of circuits D and E, and it is in the order of 100 to 10,000 KV/sec. Thus, if it is desired to obtain an amplitude in the range of 175 KV assuming 50 to 400 KeV double charge ion, frequency response only in the order of 0.57 to 57 Hz may be obtained. If the amplitude is made smaller, higher frequency response may be obtained.

On the other hand, stability of the linear characteristics of the $f_E$ oscillator A is better if $f_E$ is higher. And thus, the practical range of $f_E$ is in the range of 0.1 to 50 Hz although it is influenced by the amplitude of accelerating voltage.

Figure 1:
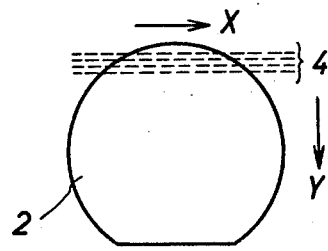
FIG. 1 is a schematic view illustrating the manner of ion implanting impurity material into a silicon wafer.
Figure 2:
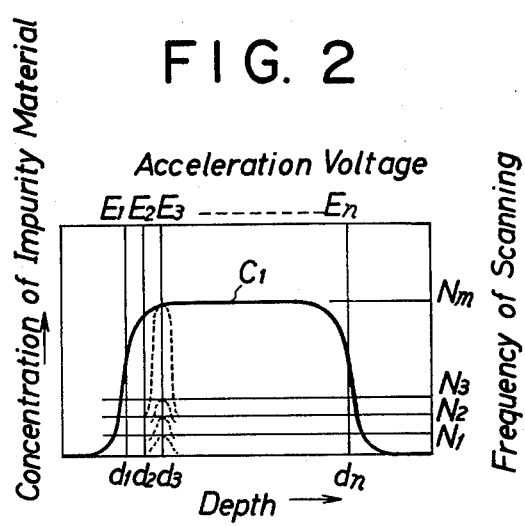
FIG. 2 is a graphic illustration of the concentration distribution of impurity material in the direction of depth of the wafer.

In an embodiment of the invention, the frequency of the output $f_E$ of the oscillator A is limited so that $f_E >> f_X$, $f_Y$ or $f_E << f_X$, $f_Y$. For example, if $f_X << f_Y$, it is preferable that $f_E$ is set so typically $f_E \leq f_X/10$ or $f_E \geq 10 f_Y$. The condition $f_E \leq f_X/10$ is selected so that impurity material is driven into the entire surface of wafer 2 to reach the depth of $d_1$, then to reach the depth of $d_2$, and so forth, repeatedly in order to produce an impurity concentration of the level represented by the curve $C_1$ of FIG. 2.

On the other hand, the condition $f_E \geq 10 f_Y$ is selected so as to make first a pillar shaped impurity layer wherein impurity concentration is uniform from the surface of the wafer to a desired depth, then the layer is extended successively to the entire surface of the wafer 2 in order to obtain a similar concentration distribution. The result obtained by either process is practically the same. If the condition is set such that $f_X/10 < f_E < 10 f_Y$, $f_X$ and $f_Y$ approach $f_E$, resulting in an uneven distribution of impurity material, in which case three-dimensional uniform distribution may not be obtained in the interior of wafer 2. This is not practical.

Where the frequency of $f_E$ is lowered, it is more advantageous to change $f_E$ continuously and periodically than to change it in a step fashion. The reason therefor will now be explained. Assuming $f_X \approx 100$ Hz, $f_Y \approx 1000$ Hz, power source through rate 10,000 KV/sec, and $\Delta E$, the increment of $f_E$ when $f_E$ is stepped up, being approximately 35 KV in order to increase the scanning frequency, $\Delta t \approx 0.0035$ sec. This time is needed for each increment of $\Delta E$, that is, for each X-scan period 0.01 sec. This means that the implanting time is made longer by 35%. If $f_E$ is changed continuously, there will be no such loss time.

Figure 5A:
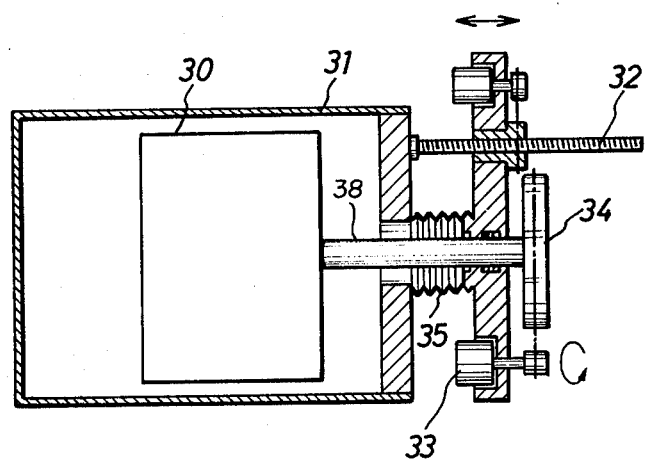
FIG. 5C is a side view of a part of the mechanical scanner of FIG. 5A.
Figure 5B:
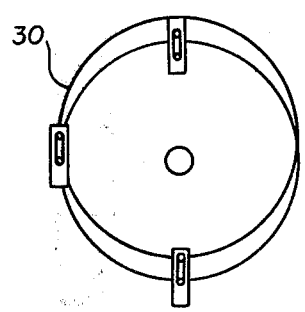
Figure 5C:
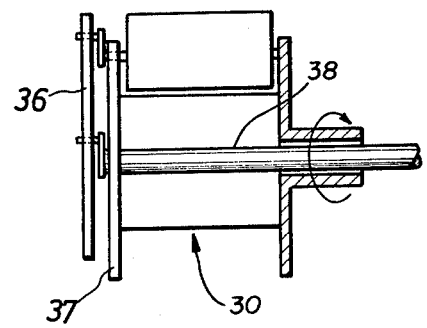

So far, the embodiment of the invention has been described with respect to electrostatic scanning. An embodiment of the invention with a mechanical scanning means will now be described referring to FIGS. 5A, 5B and 5C. A rotating barrel type scanner 30 has a peripheral dimension of approximately 135 cm for mounting wafers each having a diameter of 75 mm, and the barrel is rotated at the rate of 30 RPM. Scanner 30 is contained in a case 31 which is adjustably moved by a screw 32, and the scanner itself is driven by a motor 33 which rotates wheel 34 of which shaft 38 is enclosed by bellows 35. Two circular plates 36, 37 are arranged at one side of the scanner 30 to hold wafers in such a manner that during the rotation of the plates the ions are always implanted at a predetermined constant angle which is usually a right angle with the major surface of the wafer. Such a device is conventional and is not claimed as such.

It is noted that $f_X$ is in the order of 0.01 Hz at the most. If the frequency of $f_E$ is reduced to 1/10, it means that one cycle of $f_E$ takes 1000 sec. Cycles of $f_E$ in the range of 5 to 50 cycles are required in order to keep uniformity of the impurity layer, so that $f_E$ should have a frequency higher than $f_Y$. For the energy to complete one cycle while the ion beam crosses a given point on the wafer, $f_E \approx 33.5$ Hz where beam size is approximately 2 cm. The peripheral dimension and RPM of the scanner are in the order given above according to the equation $\Delta t = (\Delta l/nL)t$.

Figure 6:
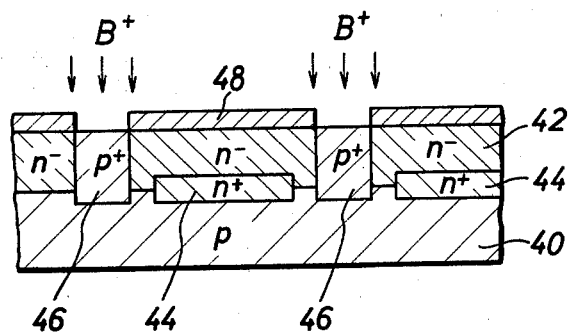
FIG. 6 is a cross-sectional view showing the structure of isolation regions of bipolar integrated circuits made by the equipment of the invention.

FIG. 6 is a cross-sectional view of the isolation structure of a bipolar integrated circuit made by ion implantation using the equipment according to the invention. Substrate 40 is a p-type silicon semiconductor on which surface is grown an $n^-$-type epitaxial layer 42. Buried layers 44 of an $n^+$-type are collector regions of transistors which are isolated by deep $P^+$-type isolation regions 46. These isolation regions are formed by ion implantation using the equipment according to the invention. For example, boron ($B^+$) is ion implanted at a dose of $3 \times 10^{15}$ cm$^{-2}$ using a layer 48 of molybdenum as a mask. The conditions in this case are: $f_E \approx 1$ Hz, $f_X \approx 100$ Hz, $f_Y \approx 1$ KHz, with $V_E$ being varied within the range of 50 KV to 400 KV, and accelerating energy in the range of 50 KeV to 400 KeV, with continuous change being given to the ion beam. As a result, $p^+$-type isolation regions 46 having a thickness of 0.9 $\mu$m from the surface of $n^-$-type layer 42 were formed, their three dimensional concentration distribution being uniformly $3.5 \times 10^{19}$ cm$^{-3}$ ($\pm 10\%$) throughout.

Deep isolation regions 46 just described may also be formed by thermal diffusion. In case of thermal diffusion, however, concentration of impurities not only decreases from the surface toward the interior, making it difficult to produce uniform distribution, but there is also lateral diffusion creating adverse effects when high density packing of integrated circuits is required. Ion implantation of impurity material does not produce such lateral diffusion, and where the accelerating energy is automatically changed by the use of equipment according to the invention, uniform concentration distribution in the direction of depth of the wafer can reliably be obtained.

Figure 7:
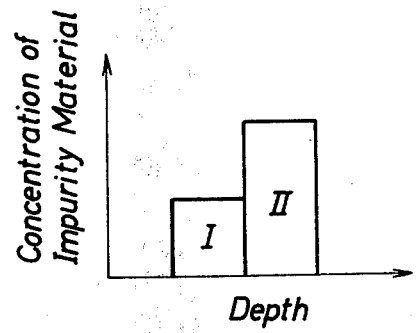
FIG. 7 is a view, similar to FIG. 2, showing another example of concentration distribution of impurity material.

By use of the equipment according to the invention, concentration distribution as shown in FIG. 7 may also be obtained. In this figure, parts I and II correspond to the part covered by the curve $C_1$ in FIG. 2 with the scanning frequency and the range within which the acceleration energy changes being modified. These parts have such concentration distribution that the concentration of impurities in the side near the surface is low and the impurity concentration in the side near the interior is high. Such a distribution cannot be obtained by diffusion of impurity material from the surface.

It will be understood from the foregoing description that the equipment according to the invention permits ion implantation which produces uniform impurity concentration in the direction of the depth of the impurity layer having a desired thickness, and it is an effective instrument for mass production of wafers of the same kind and property.

Thus, the invention having been described in its best embodiment and mode of operation, that which is claimed and desired to be protected by Letters Patent is:

1. An equipment for implanting impurity ions by scanning two dimensionally the surface of a substrate and processing same with a beam of accelerated ions of impurity material, said equipment comprising (a) means for scanning the substrate with a beam of accelerated ions and (b) means for supplying acceleration voltage and for continuously, periodically and automatically changing the acceleration voltage of the ions within a predetermined range during said scanning relative to the scanning speed.

2. An equipment of claim 1, wherein the acceleration voltage is periodically changed with a cycle $\Delta t$ which is expressed by $$\Delta t = (\Delta l/nL)t$$

where n is an arbitrary integer, L is the width of the region scanned in the direction of the scanning line of said ion beam, $\Delta l$ is the width of said ion beam and t is the period during which said ion beam crosses said region scanned in said direction.

3. An equipment of claim 1, wherein the acceleration voltage is periodically changed with a cycle $t_0 = n\Delta t_0$ where n is an arbitrary integer and $\Delta t_0$ is the period during which said ion beam begins scanning from a point and returns to said point.

4. The equipment of claim 1, 2, or 3, wherein said acceleration voltage supplying and changing means comprises an accelerator for accelerating the ion beam, and oscillator and variable power source means connected to said oscillator and said accelerator for automatically changing the acceleration voltage applied to the ion beam.

5. The equipment of claim 4, further comprising deflector means for deflecting the ion beam in the two dimensional directions on the substrate and wherein said oscillator is connected to said deflector means.

6. The equipment of claim 5, wherein said oscillator has an output frequency $f_E$ which is continuously changed.

7. The equipment of claim 6, wherein said oscillator has a frequency of $f_E$ with the following condition:

$$f_X, f_Y >> f_E >> f_x, f_Y$$

where $f_X$ and $f_Y$ represent frequency of scanning in the X and Y two dimensional directions.

* * * * *

UNITED STATES PATENT AND TRADEMARK OFFICE
CERTIFICATE OF CORRECTION

PATENT NO. : 4,410,801
DATED : Oct. 18, 1983
INVENTOR(S) : Sakurai et al.

It is certified that error appears in the above-identified patent and that said Letters Patent is hereby corrected as shown below:

Column 1, line 5, "a" should be --an--.
Column 5, line 12, "P" should be --p--.
Column 6, line 36, "and" (first occurrence) should be --an--.

Signed and Sealed this

Fifth Day of June 1984

[SEAL]

Attest:

GERALD J. MOSSINGHOFF

Attesting Officer     Commissioner of Patents and Trademarks